(12) United States Patent
Bernstein (10) Patent No.: US 6,518,759 B2
(45) Date of Patent: Feb. 11, 2003

(54) MOTION CORRECTION OF MAGNETIC RESONANCE IMAGES

(75) Inventor: Matthew A. Bernstein, Rochester, MN (US)

(73) Assignee: Mayo Foundation For Medical Education and Research, Rochester, MN (US)

(*) Notice: Subject to any disclaimer, the term of this patent is extended or adjusted under 35 U.S.C. 154(b) by 0 days.

(21) Appl. No.: 09/829,238

(22) Filed: Apr. 9, 2001

(65) Prior Publication Data

US 2002/0190714 A1 Dec. 19, 2002

(51) Int. Cl.$^7$ ................................................ G01V 3/00
(52) U.S. Cl. ........................................ 324/307; 324/309
(58) Field of Search ................................ 324/318, 307, 324/309

(56) References Cited

U.S. PATENT DOCUMENTS

| | | |
|---|---|---|
| 5,323,110 A | 6/1994 | Fielden et al. |
| 5,382,902 A | 1/1995 | Taniguchi et al. |
| 5,581,184 A | 12/1996 | Heid |
| 5,800,354 A | 9/1998 | Hofland et al. |
| 5,912,557 A | 6/1999 | Wilman et al. |
| 6,076,006 A | 6/2000 | Van Den Brink et al. |
| 6,118,273 A | 9/2000 | Takizawa et al. |

OTHER PUBLICATIONS

Two–Step Navigatorless Correction Algorithm For Radial k–Space MRI Acquisitions, MRM 45:277–288 (2001), Ajit Shankaranarayanan.

*Primary Examiner*—Edward Lefkowitz
*Assistant Examiner*—Dixomara Vargas
(74) *Attorney, Agent, or Firm*—Quarels & Brady, LLP (57) ABSTRACT

A CE-MIRA image is acquired using a centric view order. The acquired k-space data set is motion corrected by reconstructing tracking images from successive annular segments of k-space data and detecting the location of a point spread object therein. Each k-space data segment is phase corrected to align the point spread object with a reference position.

10 Claims, 7 Drawing Sheets

MOTION CORRECTION OF MAGNETIC RESONANCE IMAGES

BACKGROUND OF THE INVENTION

The field of the invention is nuclear magnetic resonance imaging methods and systems. More particularly, the invention relates to the correction of motion artifacts in MR images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles, or "views," in which these gradients vary according to the particular localization method being used. The resulting set of received NMR signals are digitized and processed to reconstruct the image using one of many well known reconstruction techniques.

Depending on the particular view order used, object motion during the acquisition of NMR image data can produce blurring or "ghosts" in the phase-encoded direction, or both. For most physiological motion each view of the NMR signal is acquired in a period short enough that the object may be considered stationary during the acquisition window. In such case the blurring and ghosting is due to the inconsistent appearance of the object from view to view. Motion that changes the appearance between views such as that produced by a patient moving, by the respiration or the cardiac cycle, or by peristalsis, is referred to hereinafter as "view-to-view motion". Motion may also change the amplitude and phase of the NMR signal as it evolves during the pulse sequence and such motion is referred to hereinafter as "in-view motion".

One method for reducing motion artifacts in NMR images is referred to in the art as "gradient moment nulling". This method requires the addition of gradient pulses to the pulse sequence which cancel, or null, the effect on the NMR signal phase caused by spins moving in the gradients employed for position encoding. Such a solution is disclosed, for example, in U.S. Pat. No. 4,731,583 entitled "Method For Reduction of NMR Image Artifacts Due To Flowing Nuclei By Gradient Moment Nulling".

A successful method for correcting MR images for motion artifacts employs navigator signals acquired during the scan. As described in U.S. Pat. No. 4,937,526, such navigator signals are acquired periodically during the scan, and the information in these signals may be used to correct the image data for patient motion. This method is also disclosed in U.S. Pat. Nos. 5,581,184; 6,118,273; 5,800,354; 6,076,006 and 5,539,312. Unfortunately, acquisition of the navigator signals increases the scan time and can disturb the steady-state magnetization established during fast scanning.

An automatic correction method has been proposed in International PCT application WO9801828A1 in which the entropy of the reconstructed image is examined as a focus criterion by which to iteratively adjust motion estimate. The clinical application of the autocorrection method has been made possible by the discovery of improved metrics used to evaluate the quality of the image during each iteration. A number of such metrics are disclosed in co-pending PCT patent application No. PCT/US99/08123 filed on Apr. 14, 1999 and entitled "Autocorrection of MR Images for Motion Artifacts." One disadvantage of this correction technique is that it requires many repeated iterations and is computationally intensive.

The need for better motion correction methods has increased with the use of MRI systems having higher field strengths (e.g. 3 Tesla). Such systems enable the acquisition of images with smaller voxel sizes (e.g. smaller than 1 mm×1 mm×1 mm), with resulting higher image resolutions. However, such high resolution images are also easier to corrupt with motion artifacts.

SUMMARY OF THE INVENTION

The present invention is a method for correcting acquired NMR image data for subject motion, and particularly, a correction method that does not require the addition of navigator pulse sequences to the scan. The method includes acquiring a k-space NMR data set by repeating an NMR image pulse sequence to sample k-space as a series of k-space segments; reconstructing a series of tracking images from the corresponding series of k-space segments; calculating the movement of a point object in the subject during the acquisition of each k-space segment by detecting the movement of a corresponding point spread object in each tracking image; calculating a corrective phase shift for each k-space segment based on the detected movement during the acquisition; and reconstructing an image using the corrected k-space segments. The k-space segments are selected such that the location of the point object can be determined from the point spread object in their reconstructed tracking images, and in the preferred embodiment, the elliptical centric k-space view order is used for a three-dimensional acquisition, and each k-space segment is an annular region (i.e. ring) that surrounds the origin of k-space.

A general object of the invention is to correct acquired NMR image data for bulk (i.e. rigid body) subject motion without the need for additional, interleaved navigator pulse sequences and without the need for computationally intensive, iterative auto-correction post processing. By judiciously selecting the view order, tracking images can be reconstructed which enable segments of acquired k-space data to be separately motion corrected. A point object that produces an intense NMR signal is located in the field of view and produces a point spread object in each reconstructed tracking image. The point object may be a fiducial which is attached to or inserted in the subject being imaged, or it may be part of the subject, such as a blood vessel imaged in cross-section, containing contrast agent. Annular regions (rings) of k-space are used in the preferred embodiment since, with the elliptical centric view order, the views acquired during any time interval At will lie within such a ring. Thus, the entire acquisition can be sub-divided into a series of time intervals, corresponding to a series of concentric rings.

A more specific object of the invention is to motion correct a contrast-enhanced magnetic resonance angiogram (CE-MRA). The flow of contrast agent through the vasculature of interest provides intense point objects which move with the patient . A centric view order, preferably elliptical centric is used to acquire the NMR image data when the contrast agent bolus arrives in the vasculature of interest. The main advantage of using the elliptical centric view order for CE-MRA is that it can provide a high degree of venous suppression. The view order is determined by sorting the views according to their distance to the center (origin) of the $k_y$–$k_z$ plane. The sampling trajectory starts at the center of k-space and spirals outward. Each "ring" of k-space sampled in this spiral trajectory may form a k-space segment which can be separately motion corrected using the present invention.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

The motion-correction method of the present invention exploits the property that during any time interval $\Delta t$ during an elliptical centric or spiral acquisition, an annular region (ring) of raw data in the $k_y$–$k_z$ plane is acquired. Separate, independent tracking images are reconstructed from each ring of k-space data. Reconstructing an image solely from a ring of data introduces a point-spread function (PSF). The key property of this PSF is that any point object in the field of view being imaged displays a characteristic bull's-eye pattern in the tracking image. The bull's-eye pattern is centered at the true location of the point object. By registering the centers of the bull's-eye patterns in each of the tracking images, a motion correction can be performed in the full, NMR data set.

The point objects can either be externally placed fiducial markers which are fixed to the patient, or they can be small bright structures in the patient, such as contrast-enhanced vessels. The dimensions of fiducial markers can be controlled, and minimizing the size of the "point" object makes it easier to detect in tracking images reconstructed from peripheral k-space rings, (i.e., data acquired later in the scan), since object size and extent in k-space are reciprocally related. Also, the constant signal produced by a fiducial marker can make it easier to track than a vessel, which typically has a time-dependent contrast enhancement.

In the preferred embodiment of the invention an elliptical concentric view order such as that disclosed in U.S. Pat. No. 5,912,557 is used to sample 3D k-space as a series of annular rings of increasing diameter. As the following discussion will show, each tracking image reconstructed from such an annular ring of k-space data produces a very imperfect image, but an image which includes image objects that correspond to each strong point object in the subject. Most importantly, even though the image objects do not look like the point objects, due to the grossly undersampled k-space, one can determine the location of the point objects in the tracking image. In the case of the elliptical concentric view order, the image objects are rings which are concentric about the location of their corresponding point object positions.

Figure 9A:
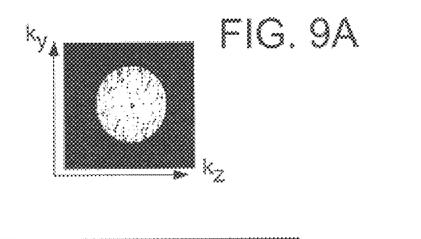
FIGS. 9b, 9d and 9f are exemplary target images reconstructed from segments of k-space in FIGS. 9a, 9c and 9e, respectively.
Figure 9B:
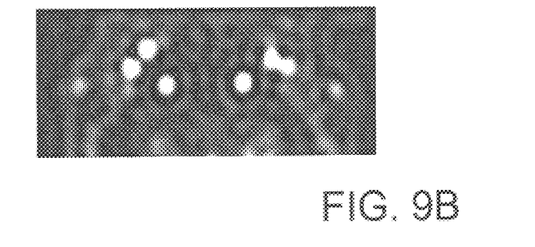
Figure 9C:
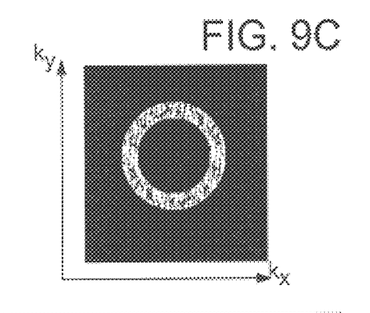
Figure 9D:
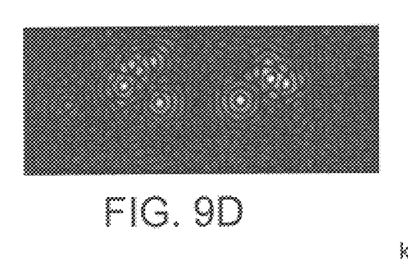
Figure 9E:
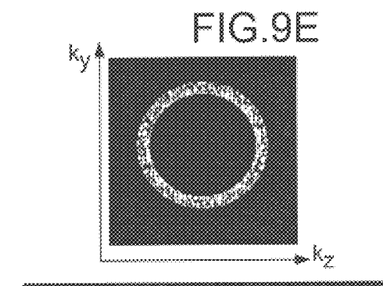
Figure 9F:
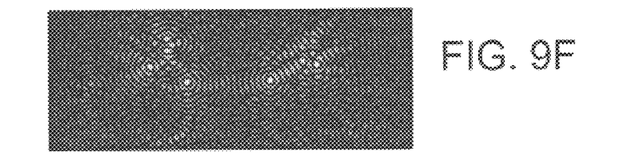

This is illustrated in FIG. 9, where FIG. 9a illustrates the first k-space data segment acquired during the first 5 seconds of a scan and FIGS. 9c and 9e illustrate annular rings of k-space acquired in the following two 5 second intervals. FIG. 9b is an image reconstructed from the central disc of k-space data in FIG. 9a and because of the gross undersampling of k-space, objects are very blurred and aliased. Nevertheless, the location of point objects (in this case contrast enhanced arteries) can be determined. FIG. 9d illustrates the image reconstructed from the annular k-space segment of FIG. 9c, and FIG. 9f illustrates the image reconstructed from the annular k-space segment in FIG. 9e. In both cases, even though the images suffer in quality, the location of the point sources can be found.

Figure 6:
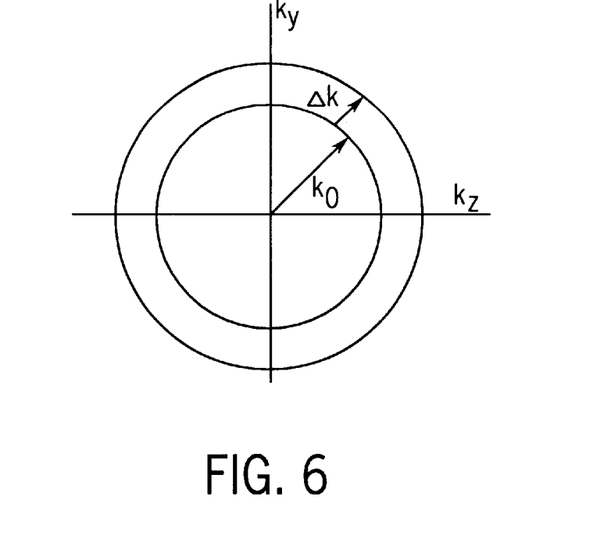
FIG. 6 is a graphic representation of an annular region of k-space sampled during a centric acquisition and used to reconstruct a tracking image.

Consider an annular region (i.e., a ring) of k-space with inner radius $k_0$, and outer radius $k_0+\Delta k$ as shown in FIG. 6. The effect of selectively reconstructing a tracking image from this ring of k-space data can be determined by calculating the PSF. The PSF is calculated by performing the two-dimensional Fourier transform of the ring. Defining polar coordinates (k, θ) in k-space, where $$k = \sqrt{k_y^2 + k_z^2}, \quad \theta = \arctan\frac{k_y}{k_z} \tag{1.1}$$

$$PSF(\vec{r}) = \int_{ring} e^{-2\pi i \vec{k}\cdot\vec{r}} d^2k = \int_{k=k_0}^{k_0+\Delta k}\int_{\theta=0}^{2\pi} e^{-2\pi i k r \cos\theta} d\theta\, dk \tag{1.2}$$

The factor of $2\pi$ in the exponential in Eq. (1.2) is required since the gyromagnetic ratio will be measured in units of linear frequency per field, e.g. 4257 Hz/Gauss. The integrals in Eq. (1.2) can be evaluated analytically to yield:

$$PSF(r) = \frac{(k_0+\Delta k)J_1(2\pi r(k_0+\Delta k)) - k_0 J_1(2\pi r k_0)}{r} \tag{1.3}$$

where $J_1(x)$ is the first order Bessel function. The full-width at half maximum (FWHM) can be calculated numerically. An approximate analytical expression for the FWHM can be determined from the Taylor expression:

$$J_1(x) = \frac{2}{x} - \frac{x^3}{16} + \cdots \quad (1.4)$$

which yields $$FWHM \approx \frac{1}{\pi}\sqrt{\frac{8\left(k_0 + \frac{\Delta k}{2}\right)}{\Delta k^3 + 4\Delta k^2 k_0 + 6\Delta k k_0^2 + 4k_0^3}} + \cdots \quad (1.5)$$

The value of the FWHM given by Eq. (1.5) provides a good estimate of the FWHM, typically underestimating its true value by about 10%.

To convert the parameters $k_0$ and $\Delta k$ which appear in equations. (1.3) and (1.5) to a specified time interval during the acquisition, first the rate of k-space area traversal R is calculated:

$$R = \frac{\Delta k_y \Delta k_z}{TR} = \frac{1}{FOV_z FOV_y TR} \quad (1.6)$$

where TR is the pulse sequence repetition time, and $FOV_y$ and $FOV_z$ are the fields of view in the y and z directions, respectively. If a ring of k-space is acquired during the time interval ($t_0 \to t_0 + \Delta t$), then the k-space parameters $k_0$ and $\Delta k$ which appear in the point-spread function are given by:

$$k_0 = \sqrt{\frac{Rt_0}{\pi}}, \quad (1.7)$$

$$\Delta k = -k_0 + \sqrt{k_0^2 + \frac{R\Delta t}{\pi}}$$

Figure 7:
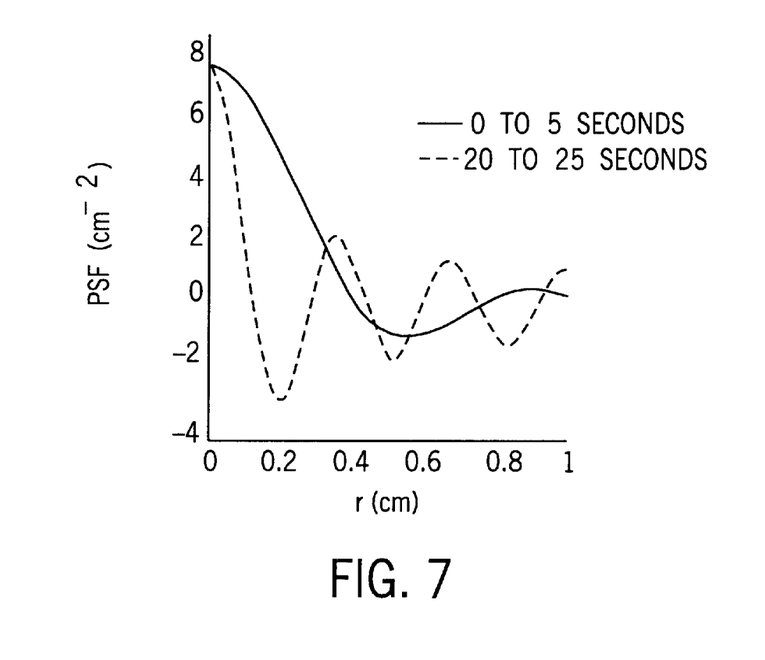
FIG. 7 is a graphic representation of point spread functions for a central disk of k-space and two subsequently-acquired rings of k-space.

FIG. 7 shows examples of the point-spread function plotted for a central disk, and two progressively larger rings of k-space, all with $\Delta t=5$ seconds: $t=0-5$ seconds, $t=20-25$ seconds, and $t=30-35$ seconds. The value of R is set to 1.43. $cm^{-2}$/sec.

The point-spread function in equation (1.3) has several important properties that will be used to analyze the motion correction method. First note that the point-spread is solely a function of the magnitude of the vector r:

$$PSF(\vec{r}) = PSF(\|\vec{r}\|) = PSF(r), \quad r = \sqrt{y^2 + z^2} \quad (1.8)$$

As a consequence of equation (1.8) an image of a point source in the y-z plane will be spread out concentrically about its true location in the reconstructed tracking image. The zero-crossings of the point-spread function generate a bull's-eye pattern in the tracking image depiction of a point source. These two properties are important because it makes it feasible to track the true location of the point source in the tracking image reconstructed from a ring of k-space, simply by finding the center of the resultant bull's-eye pattern.

This property of the PSF is proved by calculating its convolution with a point source represented by a Dirac delta function in Cartesian or polar coordinates. The delta function provides a convenient mathematically approximation of a small, disk shaped object like a marker or an enhanced vessel in cross-section. If the point source is located at ($y_0$, $z_0$)=($r_0 \cos_{\phi 0}$, $r_0 \sin_{\phi 0}$):

$$I(y, z) = \int_{r'=0}^{\infty} \int_{\varphi=0}^{2\pi} \delta(z' - z_0)\delta(y' - y_0) PSF(\vec{r} - \vec{r}')r'dr'd\varphi = \quad (1.9)$$

$$\int_{r'=0}^{\infty} \int_{\varphi=0}^{2\pi} \frac{\delta(r' - r_0)}{r'} \delta(\varphi' - \varphi_0) PSF(\|\vec{r} - \vec{r}'\|)r'dr'd\varphi =$$

$$PSF(\|\vec{r} - \vec{r}_0\|)$$

Another important property of the point-spread function in equation (1.3) is its functional dependence for large values of r. Since $$J_1(x) = \sqrt{\frac{2}{\pi x}} \cos\left(x - \frac{3\pi}{4}\right), \text{ where } x \text{ is} \gg 1, \quad (1.10)$$

the radial dependence of the envelope of the point-spread function is $$envelope[PSF(r)] = \frac{1}{r^{\frac{3}{2}}}, r \gg \frac{1}{2\pi(k_0 + \Delta k)} \quad (1.11)$$

According to equations (1.9) and (1.11) the image intensity from a point source reconstructed from a ring of k-space will falloff as the inverse three-half power of the distance from the point source. In practice the larger the exponent the better, since more rapid falloff of the ringing leads to less interference between the point source and the ringing from other objects in the tracking image.

The functional dependence of the falloff in equation (1.11) highlights an advantage of using rings of k-space rather than of strips of k-space that would correspond to a conventional Cartesian acquisition. The equivalently normal PSF for a Cartesian acquisition is $$PSF(y) = N_z \Delta k_z \Delta k_y \frac{\sin(\pi \Delta k_y y)}{\pi \Delta k_y y} \quad (1.12)$$

where $N_z$ is the number of z-points (i.e., slices or sections) in the acquisition. Comparing equations (1.3) and (1.12), the envelope of the PSF from a strip of k-space falls off only as the inverse first power of y, i.e. more slowly than for the rings. This means that the pint source used for tracking can be more readily discerned from surrounding structures when the elliptical centric view order is used.

DESCRIPTION OF THE PREFERRED EMBODIMENT

Figure 1:
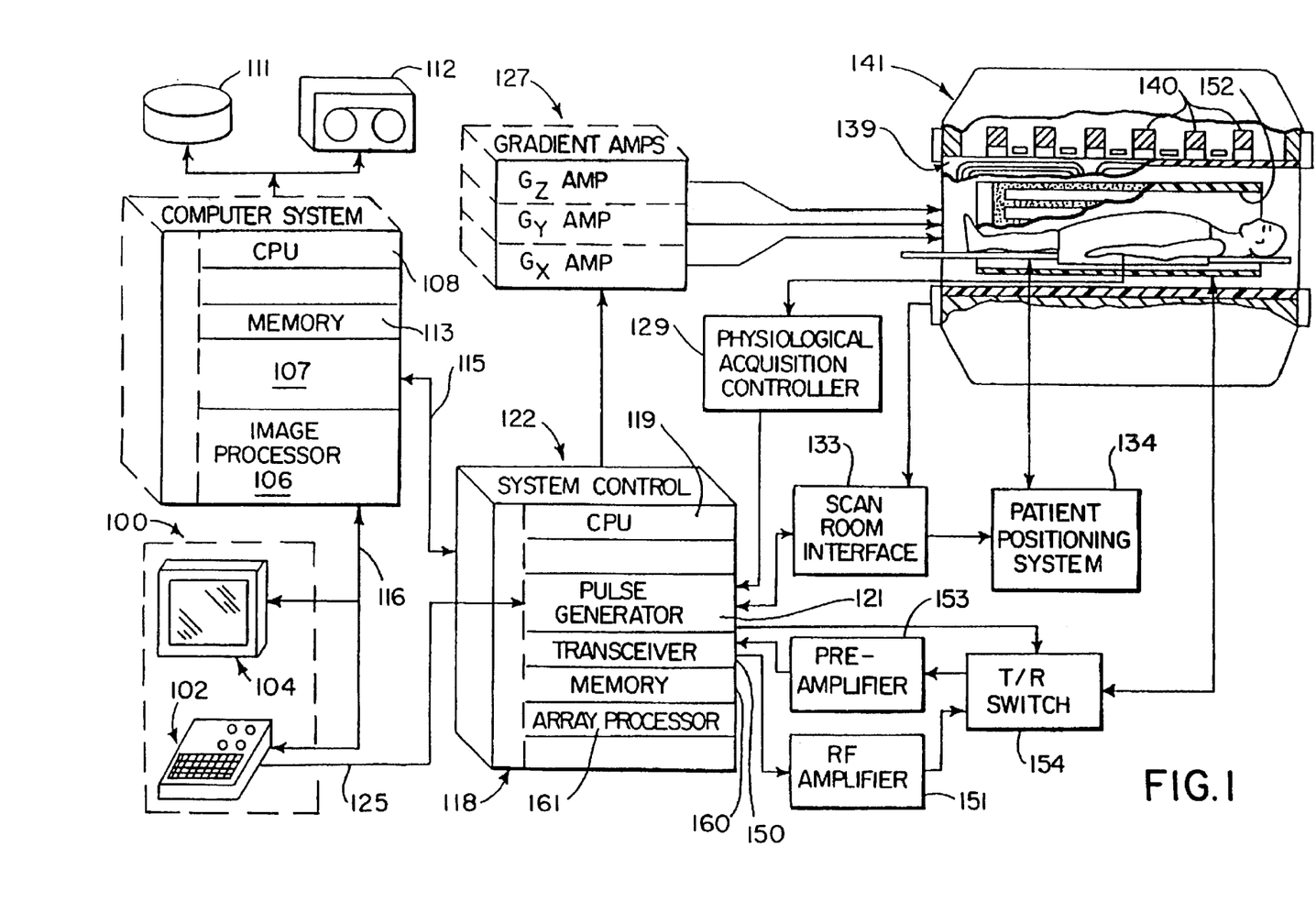
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152 a transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
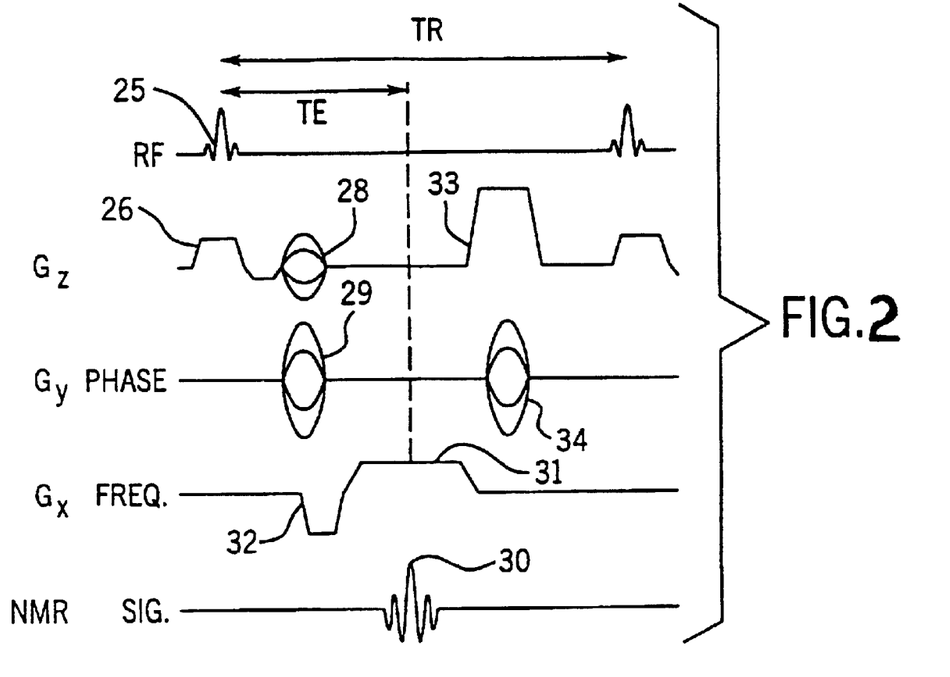
FIG. 2 is a graphic representation of a 3DFT pulse sequence performed by the NMR system of FIG. 1 to practice a preferred embodiment of the invention.

The NMR system of FIG. 1 performs a series of pulse sequences to collect sufficient NMR data to reconstruct an image. Referring particularly to FIG. 2, an exemplary pulse sequence for conducting a 3 DFT NMR scan is shown. The pulse sequence commences by the selective excitation of the entire region of interest with an RF excitation pulse 25 in the presence of a slab select $G_z$ gradient pulse 26. The frequency content of the excitation pulse 25 and the amplitude of the slab select $G_z$ pulse 26 are selected to produce transverse magnetization in the region which is the subject of the 3D scan. A negative $G_z$ pulse 27 is then produced to rephase the spins in preparation for the phase encoding and readout.

Phase encoding is performed along two axes: the z-axis and the y-axis. The z-axis encoding is accomplished by applying a $G_z$ phase encoding pulse 28 and the y-axis encoding is accomplished by applying a $G_y$ phase encoding pulse 29. As is well-known to those skilled in the art, the magnitude of the phase encoding pulses 28 and 29 are stepped through a series of positive and negative values during the scan, but each is set to one value during each pulse sequence. As will be described in detail below, it is the order in which these phase encoding pulses 28 and 29 are stepped through their set of values which is of importance to practicing the present invention. As is well-known in the art, the magnitude of a phase encoding gradient pulse is determined by the integral of its amplitude over its duration (i.e. its area). In most pulse sequences the duration is kept constant and the phase encoding pulse magnitude is stepped through its values by changing its amplitude.

After phase encoding the transverse magnetization, the NMR signal 30 is read-out in the presence of a $G_x$ read-out gradient 31. This read-out is preceded by a negative $G_x$ gradient pulse 32 to produce the gradient refocused NMR echo signal 30 in the usual fashion. It can be appreciated by those skilled in the art that either a full echo signal 30 as shown in FIG. 2 may be acquired, or a partial echo signal may be acquired to reduce the pulse sequence TR. In the latter case, the missing samples are estimated using a homodyne reconstruction method or the like. The 3DFT pulse sequence is then concluded by the application of a large $G_z$ spoiler gradient pulse 33 and a $G_y$ rewinder gradient pulse 34 to prepare the magnetization for the next pulse sequence which follows immediately. As is known to those skilled in the art, the spoiler pulse 33 dephases transverse magnetization and the rewinder pulse 34 refocuses transverse magnetization along the y-axis in preparation for the next pulse sequence. The rewinder pulse 34 is equal in magnitude, but opposite in polarity with the $G_y$ phase encoding pulse 29.

The acquisition of data in 3DFT scanning can be considered sampling of a three-dimensional "k-space". Two of the dimensions, $k_y$ and $k_z$, are sampled by applying different phase encoding gradients $G_y$ and $G_z$ during each pulse sequence of the scan, and each acquired NMR signal contains 256 samples along a line in the $k_x$ direction. The $k_y$ and $k_z$ phase encodings are defined as the gyromagnetic ratio ($\gamma$) times the area under the $G_y$ and $G_z$ gradient waveforms applied after the RF excitation pulse 25 and before the readout of echo signal 30. The pulse sequence is repeated for as many repetitions as are necessary to sample all desired $k_y$ and $k_z$ values. For example, $k_y$ may assume 128 different values and $k_z$ may have 64 values. In this case the number of repetitions of the pulse sequence of FIG. 2 would be 128×64 or 8192.

Figure 3:
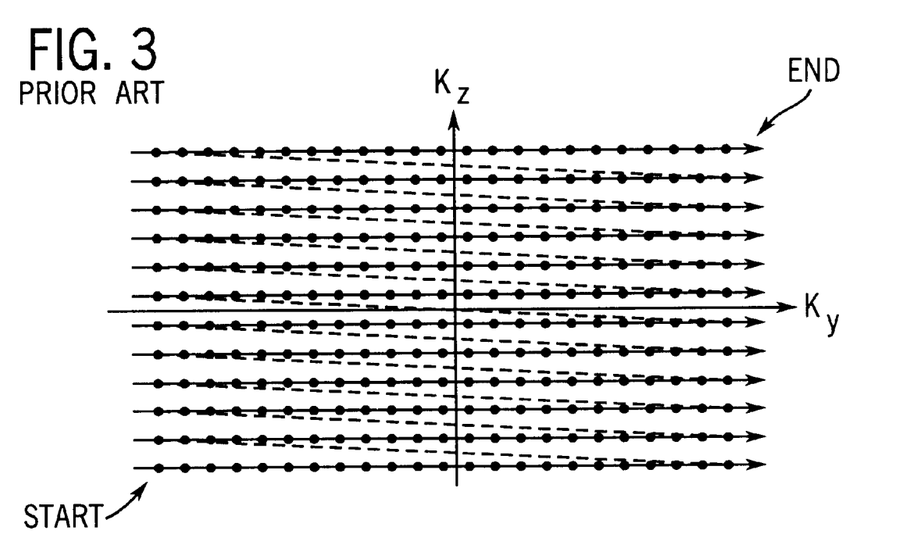
FIG. 3 is a graphic representation of a conventional Cartesian k-space sampling trajectory using the pulse sequence of FIG. 2.

With conventional 3DFT scanning the desired values of $k_y$ and $k_z$ are sampled with two nested loops. For example, the inner loop increments $k_y$ through its 128 values and after all such samples have been made for a given value of $k_z$, the outer loop increments $k_z$. This process continues until all 128 values of $k_y$ have been sampled at each of the 64 values of $k_z$. A diagram of this prior process is shown in FIG. 3, where the vertical axis indicates the sample along $k_z$ produced by the magnitude of the $G_z$ phase encoding pulse, and the horizontal axis indicates the sample along $k_y$ produced by the magnitude of the $G_y$ phase encoding pulse. The arrow shows the temporal trajectory through ($k_y$, $k_z$) space of the sampling during the scan. The sampling starts in the lower left corner with negative $k_y$ and $k_z$ samples, and ends at the upper right corner with positive $k_y$ and $k_z$ samples. In this conventional scan, therefore, ($k_y$, $k_z$) space is scanned in much the same way as a television screen is scanned.

Figure 4:
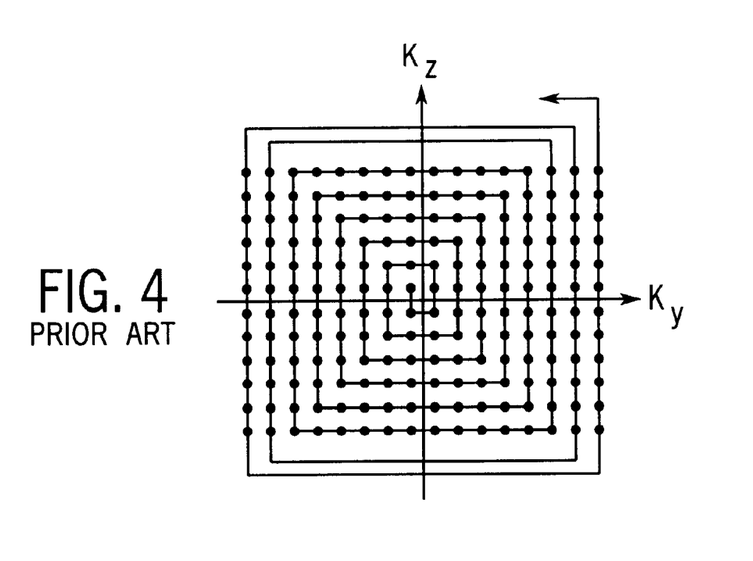
FIG. 4 is a graphic representation of a centric k-space sampling trajectory using the pulse sequence of FIG. 2.

Centric view ordering is based on the realization that for most objects the bulk of the signal power is contained in the samples taken near the origin of ($k_y$, $k_z$) space, and it is these samples which contribute most significantly to the appearance of the reconstructed image. This results from the fact that the NMR signals acquired during the scan are Fourier transformed along the $k_x$, $k_y$ and $k_z$ directions to produce intensity values for an image in real (x,y,z) space. It is the nature of this transformation that the samples near the origin ($k_y$=0, $k_z$=0) contribute a disproportionate share to the signal power of the reconstructed image. Accordingly, it is a basic idea of centric view ordering to sample the ($k_y$, $k_z$) points which contain the most signal power in as short a time and as close to the beginning of the scan as possible. This can be done by modifying the trajectory with which the ($k_y$, $k_z$) space is sampled. Specifically, a square spiral ($k_y$, $k_z$) trajectory, such as that shown in FIG. 4 may be used. The scan starts at or near the origin of ($k_y$, $k_z$) space and progressively works its way outward in a spiral fashion. In FIG. 4, a 12×16 array of k-space samples are acquired, but this is only illustrative, since in practice many more samples are usually acquired to cover the field of view with adequate resolution. The manner in which the values of the $G_y$ and $G_z$ phase encoding gradients may be stepped to accomplish such a spiral trajectory scan is described in U.S. Pat. No. 5,122,747.

A second, and more preferred centric view order is the so-called elliptical centric view order described in U.S. Pat. No. 5,912,557. This is a view order based on the distance of the sample point from the origin of k-space. First, we assume that the field of view along y is FOV and that the field of view along z is some fraction of this, FOV/N. The $k_y$ values which are to be sampled in the phase encoding process are +1/(2 FOV), ±3/(2 FOV), ±5/(2 FOV), . . . , ±m/(2 FOV), where 2m is the total number of $k_y$ phase encodes desired. This assumes that the $k_y$ origin is not sampled and the smallest nonzero $k_y$ spatial frequencies sampled are at ±1/(2 FOV). Similarly the $k_z$ values which are to be sampled are ±N/(2 FOV), ±N3/(2 FOV), ±N5/(2 FOV), . . . , ±N/(2 FOV), where 2 n is the total number of $k_z$ phase encodes. All phase encodings to be sampled can then be characterized by the index (i,j), where $-m \leq i \leq m$ and $-n \leq j \leq +n$ and i and j assume nonzero integer values. The distance from the k-space origin to the sample point is characterized by the indices (ij) and is equal to (1/FOV) sqrt $\{[2|i|-1]^2+N^2[2|j|-1]^2\}$ where "sqrt" denotes the operation of taking the square root and ⌴*⌴ denotes absolute value of *. Once the distance is determined for all k-space sample points (i,j), the points are ranked on the basis of their respective distances with the point having the smallest distance being ranked first. In this way, the ordered list of desired phase encodings, or views, is determined.

The advantage of the elliptical centric view order for the motion correction described here is that k-space is sampled as a series of circular-shaped annular rings. The point spread function for circular rings is superior to the point spread function of other shaped segments of k-space in that a point source is more easily located in the reconstructed target image.

While most MRA clinical applications benefit from the centric view order in which the center of k-space is acquired first, there are applications in which the same k-space sampling trajectory is employed in reverse order. This "reverse centric" view order also follows a spiral-like sampling trajectory which circles the center of k-space, but in this case sampling spirals inward toward the center of k-space.

The characteristic of both the centric and reverse-centric view orders that is important to the present invention is that the acquisition can be divided into a series of k-space sampling segments which are encircling, ring-like segments of k-space. Each k-space sampling segment is comprised of k-space samples from one or more complete revolutions around the center of k-space. These ring-like k-space segments have point spread functions which enable the location of point objects to be determined in images reconstructed from the k-space samples.

Figure 5:
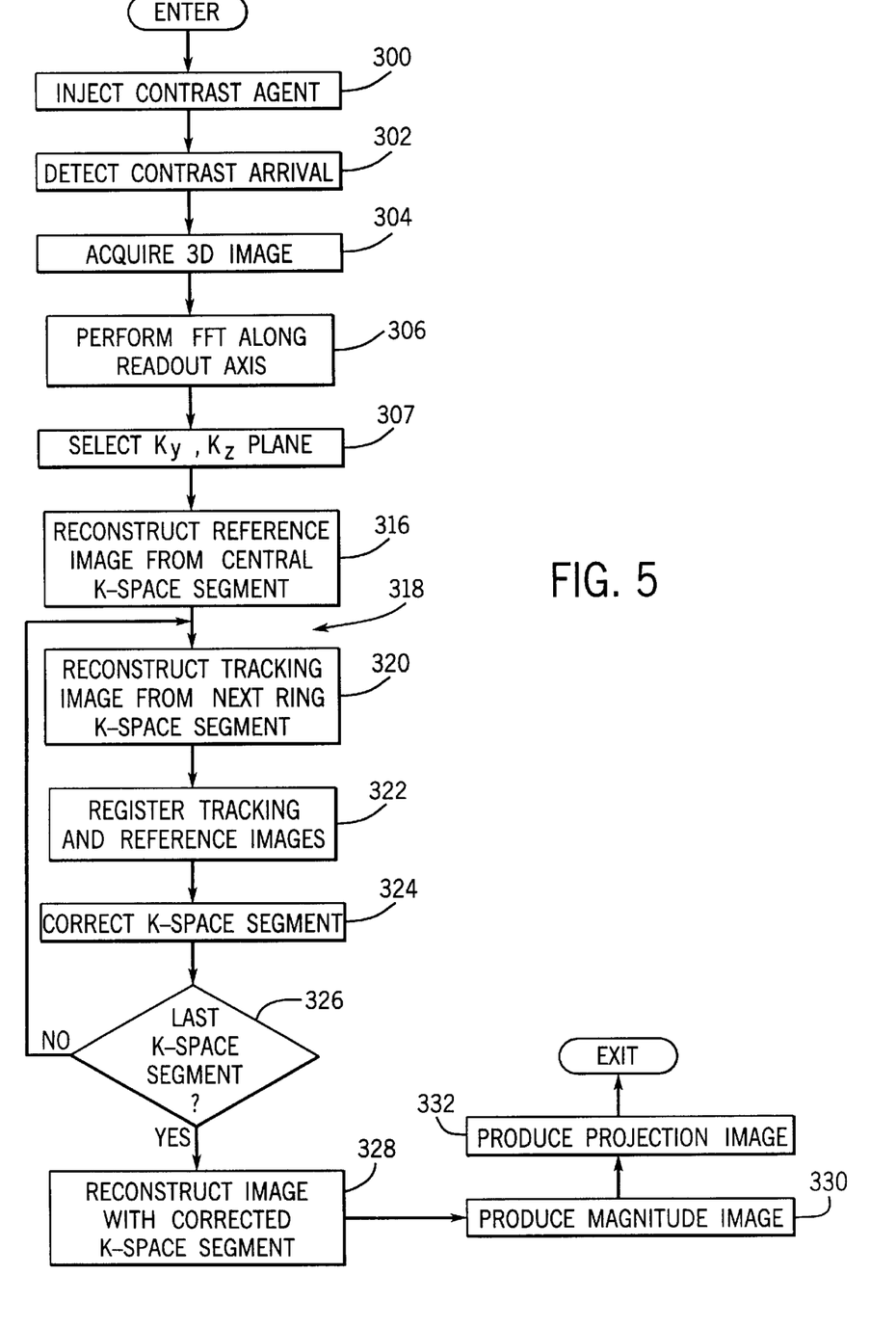
FIG. 5 is a flow chart illustrating the steps employed in the preferred embodiment to motion correct an image acquired with the centric view order in FIG. 4.

Referring particularly to FIG. 5, the preferred embodiment of the invention is employed in a CE-MRA acquisition of the carotid and vertebral arteries of a patient. As indicated at process block 300, a contrast agent is injected into the patient, and when the contrast arrives in the arteries of interest, a 3D image is acquired using the above-described pulse sequence and a centric view order as indicated at process block 304. Contrast arrival can be detected as indicated at process block 302 in a number of different ways. In the preferred embodiment low resolution 2D images are acquired at a high frame rate and the physician initiates the image acquisition when enhanced contrast is seen in the arteries. Automatic methods can also be used to initiate the scan such as the method disclosed in U.S. Pat. No. 6,167, 293. A three-dimensional array of k-space data is acquired during the scan and stored in memory.

As indicated in process block 306, the first step in the image reconstruction process is to perform a fast Fourier transformation of the 3D k-space data set along the readout gradient axis. In the preferred embodiment the readout axis is the x-axis. It can be appreciated by those skilled in the art that if a partial echo acquisition is employed to acquire the k-space image data set this step is more complicated than a one-dimensional FFT. Instead, the missing k-space data are estimated using a technique such as that described by Douglas Noll, et al., "Homodyne Detection In Magnetic Resonance Imaging," *IEEE Trans. On Medical Imaging*, vol. 10, Jun. 2, 1991. Also, in that case, the homodyne reconstruction in the readout direction would be performed after the Fourier transformations along the phase encoding axes. In either case, the result is a three-dimensional array of data composed of a set of $k_y$, $k_z$ planes disposed along the x axis. One of these planes is selected, as indicated at process block 307, as being representative of the bulk motion of the entire region of interest. Phase corrections will be calculated for the selected $k_y$, $k_z$ plane and these phase corrections are applied to corresponding $k_y$, $k_z$ elements in all the x-axis planes. In alternative embodiments of the invention the phase corrections can be separately calculated for each $k_y$, $k_z$ plane in the data set, or the data set may be divided into separately corrected groups, or slabs, of $k_y$, $k_z$ planes.

Figure 8:
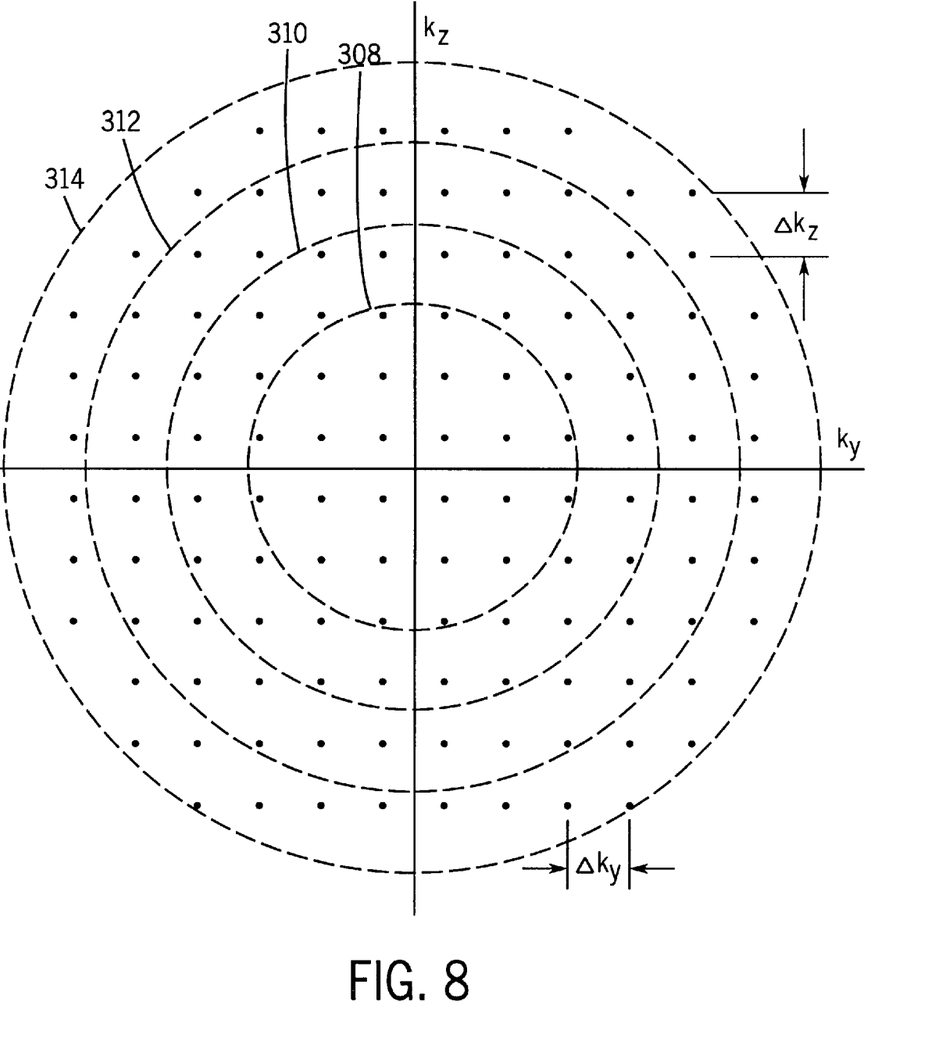
FIG. 8 is a graphic representation showing k-space segments used in one preferred embodiment of the invention.

As shown in FIG. 8 the k-space defined by the $k_y$ and $k_z$ axes in the selected plane along the z-axis is divided into segments. These segments include a central disc of k-space samples bounded by dashed line 308 and a plurality of annular ring-shaped segments identified by dashed lines 310, 312 and 314. FIG. 8 does not show the number of samples in each segment nor the total number of segments, but rather is illustrative of how k-space may be divided into segments. In the preferred embodiment the number of ($k_y$–$k_z$) sample points (i.e. views) is substantially the same in each segment such that the time interval $\Delta t$ required to acquire each segment is substantially the same. This time interval should be kept as short as possible and in the preferred embodiment is less then 5 seconds.

As indicated at process block 316, the next step is to reconstruct an image from the segment 308. This is done by transferring the k-space samples in segment 308 to an array in which all other sample points in the 3D array are set to zero. A 2DFT is then performed along the y and z axes and the magnitude of the transformed complex values is calculated. The resulting image forms a reference image against which the location of the subject is compared in the subsequently acquired ring segments. A loop is then entered at 318 in which the first step indicated at process block 320 is to reconstruct an image using k-space samples in the next surrounding segment. This is done with a 2DFT as described above, and a magnitude image is calculated from the result.

The next step as indicated at process block 322 is to determine the extent to which the tracking image is misregistered with the reference image. This is accomplished by finding the peak of the cross-correlation function of the two images. More specifically, if the reference image R(y,z) is:

$$R(y, z) = \left| \int\int_{\substack{central \\ segment}} d(k_y, k_z) e^{2\pi i(k_y y + k_z z)} dy dz \right|$$

where:
  $d(k_y, k_z)$ is the complex k-space data,
  $i = \sqrt{-1}$, and
  $|*|$ = the modulus of the complex quantity *.
Similarly, the tracking image T(y,z) is given by:

$$T(y, z) = \left| \int\int_{\substack{ring \\ segment}} d(k_y, k_z) e^{2\pi i(k_y y + k_z z)} dy dz \right|.$$

The degree of motion between the reference and tracking images is calculated by finding the peak of the cross-correlation function:

$$C = (\Delta y, \Delta z) = \int\int_{\substack{y-z\,image \\ plane}} R(y, z) T(y + \Delta y, z + \Delta z) dy dz.$$

The cross-correlation function $C(\Delta y, \Delta z)$ is expected to peak at values ($\Delta y$, $\Delta z$) corresponding to motion that occurred between the acquisition of the data for the reference and tracking images.

Once the values of $\Delta y$ and $\Delta z$ are determined, the complex k-space data in the ring segment that produced T(y,z) is corrected with the shift theorem as indicated at process block 324:

$$d(k_y, k_z)_{corrected} = d(k_y, k_z) e^{-2\pi i(k_y \Delta y + k_z \Delta z)}.$$

It should be noted that corrective values $\Delta y$ and $\Delta z$ can be either positive or negative, and in general, they will be different for each ring segment.

As indicated by decision block 326, the correction procedure is repeated for each ring k-space segment until the last k-space segment is corrected. A 3D k-space data set is thus produced in which all the ring k-space segments are phase corrected to offset any motion relative to the reference location. A 3D image is then produced at process block 328 by performing a fast Fourier transformation along the two phase encoding axes ($k_y$ and $k_z$ in the example) of the corrected 3D k-space data set. A 3D magnitude image is produced from the resulting complex numbers at process block 330 and a 2D projection image is produced at process block 323. Many different projection methods are known to those skilled in the art, but a maximum intensity pixel (MIP) method is preferred.

While the preferred embodiment of the invention is a CE-MRA scan using an elliptical centric view order, other clinical applications are also possible. The contrast enhanced blood vessels in CE-MRA provide good point sources that enable accurate motion corrections to be made. However, fiducials in the form of small (i.e. point source) phantoms that provide very intense NMR signals may be attached to the subject to track with subject motion. This enables the present invention to be used in other clinical applications where strong point source signals are not naturally present in the subject being imaged. Also, the use of fiducials which produce strong point source signals may enable view orders to be used which have point spread functions that are less desirable than the elliptical centric view order.

What is claimed is:

1. A method for acquiring a motion corrected image with a magnetic resonance imaging (MRI) system, the steps comprising:
   a) acquiring a k-space data set by repeating an imaging pulse sequence with the MRI system to sample k-space as a series of k-space segments;
   b) reconstructing a series of tracking images from the corresponding series of acquired k-space segments;
   c) calculating the movement of point objects in the subject during the acquisition of each k-space segment by detecting the movement of corresponding point spread objects in each tracking image;
   d) calculating a corrective phase shift for each k-space segment based on the detected movement during the acquisition of each k-space segment; and
   e) reconstructing an image using the corrected k-space segments.

2. The method as recited in claim 1 in which each k-space segment includes k-space samples from an annular region around the origin of k-space.

3. The method as recited in claim 1 in which step a) is performed with a centric view order.

4. The method as recited in claim 1 in which step a) is performed with a reverse centric view order.

5. The method as recited in claim 1 in which step c) is performed by:
   i) selecting one of the tracking images as a reference image; and
   ii) determining the amount of the motion-induced misregistration between each tracking image and the reference image by finding the peak of the cross-correlation function of each tracking image with the reference image.

6. The method as recited in claim 1 in which a three-dimensional imaging pulse sequence is used in step a) which has a readout gradient axis and two phase encoding gradient axes, and the k-space segments are defined by the values of two phase encoding gradients which sample k-space at points along two orthogonal axes in k-space.

7. The method as recited in claim 6 in which step a) is performed by using a centric view order that samples k-space defined by the two orthogonal axes as a k-space segment at the center of k-space and a series of ring k-space segments that surround the central k-space segment.

8. The method as recited in claim 7 in which step c) is performed by:
   i) selecting one of the tracking images as a reference image; and
   ii) determining the amount of the motion-induced misregistration between each tracking image and the reference image by finding the peak of the cross-correlation function of each tracking image with the reference image.

9. The method as recited in claim 6 in which the image is acquired from a living subject and the steps also include:
   injecting the living subject with a contrast agent to enhance NMR signals acquired from small anatomic structures; and
   employing the small anatomic structures as the point objects in step c).

10. The method as recited in claim 9 in which the small anatomic structures are blood vessels.

* * * * *